United States Patent
Qiu et al.

[11] Patent Number: 5,564,021
[45] Date of Patent: Oct. 8, 1996

[54] METHOD FOR ASSIGNING INTER-NODAL TRAFFIC LOADS TO CHANNELS IN SONET RINGS

[75] Inventors: Yuping Qiu, Louisville; Jennifer Ryan, Boulder; Xiaorong Sun, Boulder; Youngho Lee, Boulder, all of Colo.

[73] Assignee: US West Technologies, Inc., Boulder, Colo.

[21] Appl. No.: 252,035

[22] Filed: May 31, 1994

[51] Int. Cl.⁶ .............................. G06F 15/20; G06F 9/312
[52] U.S. Cl. ................... 395/200.21; 395/200.02; 395/200.19; 395/650; 395/800; 370/58.1; 340/825.2; 364/221.2; 364/230.3; 364/550; 364/551.01
[58] Field of Search .................... 395/200.02, 200.19, 395/200.21, 650; 370/58.1; 340/825.2

[56] References Cited

U.S. PATENT DOCUMENTS

| | | | |
|---|---|---|---|
| 4,633,387 | 12/1986 | Hartung et al. | 364/200 |
| 5,274,643 | 12/1993 | Fisk | 370/94.1 |
| 5,337,258 | 8/1994 | Dennis | 364/551.01 |
| 5,392,429 | 2/1995 | Agrawal et al. | 395/650 |
| 5,442,789 | 8/1995 | Baker et al. | 395/650 |

OTHER PUBLICATIONS

"Feasibility Study of a High–Speed Sonet Self–Healing Ring Architecture in Future Interoffice Network", Wu, et al IEEE, Nov. 1990, pp. 33–51;.

"Sonet Equipment Cost Modeling Based on AI Technology", Shyur et al. IEEE, 1992, pp. 740–743;.

"A Network Flow Model for Load Balancing in Circuit–Switched Multicomputers", Bokhari, IEEE, Jun. 1993, pp. 649–657.

Fujitsu Application Note, "Engineering Sonet Rings II: The Sequel", An 93–003; Apr. 1993.

*Primary Examiner*—Thomas C. Lee
*Assistant Examiner*—Rehana Perveen Krick
*Attorney, Agent, or Firm*—Brooks & Kushman, P.C.

[57] ABSTRACT

A method for generating an optimized solution for assigning traffic loads to channels in SONET rings in cooperation with a computer having sufficient memory. The method utilizes a Mixed Integer Program (MIP) having corresponding variables necessary to model the cost of Terminal Multiplexers, Add/Drop Multiplexers and corresponding interface ports necessary to route the desired traffic loads. By routing traffic loads to reduce computation time and imposing mathematical bounds on the MIP variables, the number of possible MIP solutions is reduced. The Mixed integer Program is minimized in accordance with the traffic routing and imposed mathematical bounds such that an electrical signal is generated which corresponds to the optimized traffic load assignment information. The signal is converted to digital format whereupon it may be retrieved from computer memory and displayed to the user.

3 Claims, 2 Drawing Sheets

METHOD FOR ASSIGNING INTER-NODAL TRAFFIC LOADS TO CHANNELS IN SONET RINGS

TECHNICAL FIELD

This invention relates generally to Synchronous Optical Networks (SONETs). More particularly, this invention relates to a method and system for generating an optimized solution for assigning traffic loads to channels in SONET rings in cooperation with a computer having sufficient memory capability.

BACKGROUND ART

Since the divestiture of the American Telephone & Telegraph Company in 1984, the Regional Bell Holding Companies (RBHCs) have focused their efforts on cutting operating costs, upgrading their networks, providing new high speed services, and interconnecting their networks to long-distance companies and international carriers. One of the tools the RBHCs have chosen to help them achieve these goals is the Synchronous Optical Network (SONET). SONET is both a standard and a set of specifications for building high speed, digital communications networks that run over fiberoptic cables while interfacing with existing electrical protocols and asynchronous transmission equipment. Fiberoptics has revolutionized telecommunications in view of the large bandwidth availability (currently estimated in the hundreds of gigabits per second) which continues to increase with technological advances such as wave-division multiplexing and similar developments in light polarization and dispersion-shifted fibers.

As those skilled in the art will recognize, SONET specifies a digital hierarchy based on Optical Carrier (OC) rather than electrical levels. SONET does define Synchronous Transport Signals (STS), however, which are electrical interfaces used as the multiplexing mechanisms within SONET Network Elements (NEs). Network elements combine STS-1s as needed up to STS-N where N is the number of STS-1s, then convert the total electrical multiplex to an Optical Carrier and transmit it over optical fiber. SONET is multiplexed at the byte level, allowing services to be dynamically placed into the broadband STS for transport. The basic SONET of 64 Kbps per byte is the same speed as the conceptual voice channel DS0 allowing SONET to easily integrate all currently used digital services into the optical hierarchy.

One of the principal benefits of SONET is that it allows for the direct multiplexing of current network services, such as DS1, DS1C, DS2, and DS3 into the synchronous payload of STS-1. As those skilled in the art will recognize, the above rates, as in the case of most defined rates, were developed based on existing transmission systems. For example, the DS1 and DS2 signal rates (1.544 million bits per second and 6.312 million bits per second) are the transmission rates of the T1 and T2 wire pair carrier systems. Initially, one multiplexer, called an M12, was used to combined four DS1 channels into a DS2, and a second multiplexer, called an M23, was used to combine seven DS2 channels into a DS3. Presently, most networks use a single multiplexer termed an M13, which combines twenty-eight DS1 channels into a DS3. Of course, one of the key attributes of these previous multiplexer designs is that they permit DS1 signals to be timed independently, i.e. asynchronous multiplexing. Bits can therefore be sent at different transmission rates because individual channels need not be synchronized to a common timing source.

The asynchronous DS3 multiplexing standard was implemented in the days when most networks utilized analog technology and the few digital systems in existence generated their own clocking systems. Significantly, the transmission specifications for DS1 signals specify that the bit rate is 1.544 million bits per second, plus or minus 75 bps. To compensate for this range, additional bits must therefore be "stuffed" into each DS1 signal before they are multiplexed to a higher rate. Again, as those skilled in the art will recognize, while bit stuffing supports independently clocked input signals, it also makes it nearly impossible to locate individual DS1 or DS0 channels within a DS3 bit stream. To extract a single channel, a DS3 signal would need to first be demultiplexed through M13 components into twenty-eight DS1s before the channels could be switched or rearranged. As a result, the process of adding or deleting channels is expensive.

In contrast to asynchronous multiplexing, the SONET standard defines a viable alternative which supports greater capacity and efficiency. In the SONET multiplexing format, the basic signal transmission rate —STS-1—operates at 51.84 million bits per second. AN STS-1 can carry 28 DS1 signals or one asynchronous DS3. STS-1 signals are then multiplexed to produce higher bit rates—STS-2, STS-3, etc. As referenced above, the other term used to define the SONET signal levels is optical carrier. The bit rates are the same in each case, so the bit rate of the STS-1 equals the bit rate of the OC-1. The only difference is the type of signal that is being referenced. For example, if the signal is in an electrical format, it is referred to as an STS. Similarly, if the signal is in an optical format—compatible with a fiber medium—it is referred to as an OC.

The SONET standards define an alternative to asynchronous DS3 multiplexing, which describes how to divided STS signals into lower speed increments, i.e. virtual tributaries. The major advantage of synchronous multiplexing is that when DS1 and other low-speed channels are multiplexed directly into the STS format, the lower speed channels can be identified and reconfigured for drop-and-insert. As a result, the drop-and-insert process can be done easier with less expensive hardware then the back-to-back M13 multiplexers used in asynchronous multiplexing.

Because of the large bandwidth availability in fiber, and the growing volume of data traffic, disruptions from link and node failures due to cable cuts, for example, become increasingly serious. Network survivability has therefore become a major concern for SONET designers and has fueled interest in what is known in the art as "ring" architectures. Such architectures take advantage of the capability provided by synchronous multiplexing in SONET to eliminate the need to backhaul traffic to central hubs. Thus, at each switching office, the SONET transport node directly accesses the required time slots in the bit stream through the use of modified Add-Drop Multiplexers (ADM). The SONET ring topology permits the creation of highly survivable networks which are viewed in the communications industry as essential for obtaining business for critical data communications.

In most cases, the deployment of SONET rings results in cost savings since it is far less expensive for carriers to install a fiber ring then to deploy point-to-point links. Consider, for example, a rural route, where linking remote terminals to a central office in a point-to-point application would require six multiplexers—one at each site and at the Central Office (CO) for each route—and six fibers, two to each site. In a ring topology, all that is required is one multiplexer at the CO and two fibers that go through a multiplexer at each site for a total of four multiplexers and two fibers. Significantly, in the ring topology, working or service traffic is routed in one direction only. If that fiber fails, traffic is rerouted on a protection fiber to flow in the opposite direction. In this manner, working traffic bypasses the failure to get to its proper destination.

Against this background, it can be readily appreciated that there is significant debate in the communications industry regarding the type and location of rings, and in particular, Self-Healing Rings (SHR) to deploy. There is similarly significant debate as to how to best assign traffic to the SONET rings once they have been deployed.

On this latter point, those skilled in the art have long recognized that current equipment available for traffic routing on SONET rings and, in particular, DS1 traffic, does not make full use of the available ring capacity. The problem of packing DS1 traffic into STS-1 time slots is combinatorially very difficult. Indeed, it becomes even more difficult if one tries to choose the packing in a way which minimizes the cost of multiplexing equipment, i.e. Terminal multiplexers, Add/Drop multiplexers and their corresponding interface ports. See, for example, the technical note "Engineering SONET Rings II: The Sequel", AN-93-003, April 1993, wherein the Fujitsu authors state that there is "no absolute solution" to the problem and provide ad hoc ideas for solving it.

Consequently, a need has developed for an optimizing tool which will provide network planners the ability to decide whether a given set of traffic and, in particular, DS1 demand may be packed on a single SONET ring. Still further, a need has developed to provide such a tool wherein the user may determine the minimum cost packing if there is more than a few DS1 demands.

Still further, a need has developed for such a system wherein the user may determine the optimized solution for traffic routing and, in particular, the number of multiplexers and interface ports.

DISCLOSURE OF THE INVENTION

It is an object of the present invention to provide a method and system of generating an optimized solution for assigning inter-nodal traffic loads to channels in SONET rings in cooperation with a computer having memory.

It is another object of the present invention is the provision of a method and system for assigning inter-nodal traffic loads to channels in SONET rings of the type referenced above wherein a Mixed Integer Program (MIP) is utilized and minimized in accordance with corresponding variables wherein mathematical bounds are imposed in a preprocessing step so as to reduce the computation time necessary to obtain the optimized solution.

In realizing the aforementioned and other objects, features and advantages of the present invention, the method and system herein disclosed utilizes a Mixed Integer Program (MIP) having corresponding variables necessary to model the cost of Terminal multiplexers, Add/Drop multiplexers and corresponding interface ports necessary to route the desired traffic loads. By routing traffic loads to reduce computation time and imposing mathematical bounds on the MIP variables, the number of possible MIP solutions may be dramatically reduced. The Mixed Integer Program may thereafter be minimized in accordance with the traffic routing and imposed mathematical bounds such that an electrical signal may be generated which corresponds to the optimized traffic load assignment information for receipt by the computer memory. This optimized traffic load assignment information may thereafter be converted to digital format whereupon it may be retrieved from the computer memory and displayed to the user.

The above objects and other objects, features, and advantages of the present invention are readily apparent from the following detailed description of the best mode for carrying out the invention when taken in connection with the accompanying drawings wherein like reference numerals correspond to like components.

BRIEF DESCRIPTION OF THE DRAWINGS

A more complete appreciation of the invention and many of the attendant advantages thereof may be readily obtained by reference to the following detailed description when considered with the accompanying drawings in which like reference characters indicate corresponding parts in all the views, wherein.

BEST MODES FOR CARRYING OUT THE INVENTION

Figure 1:
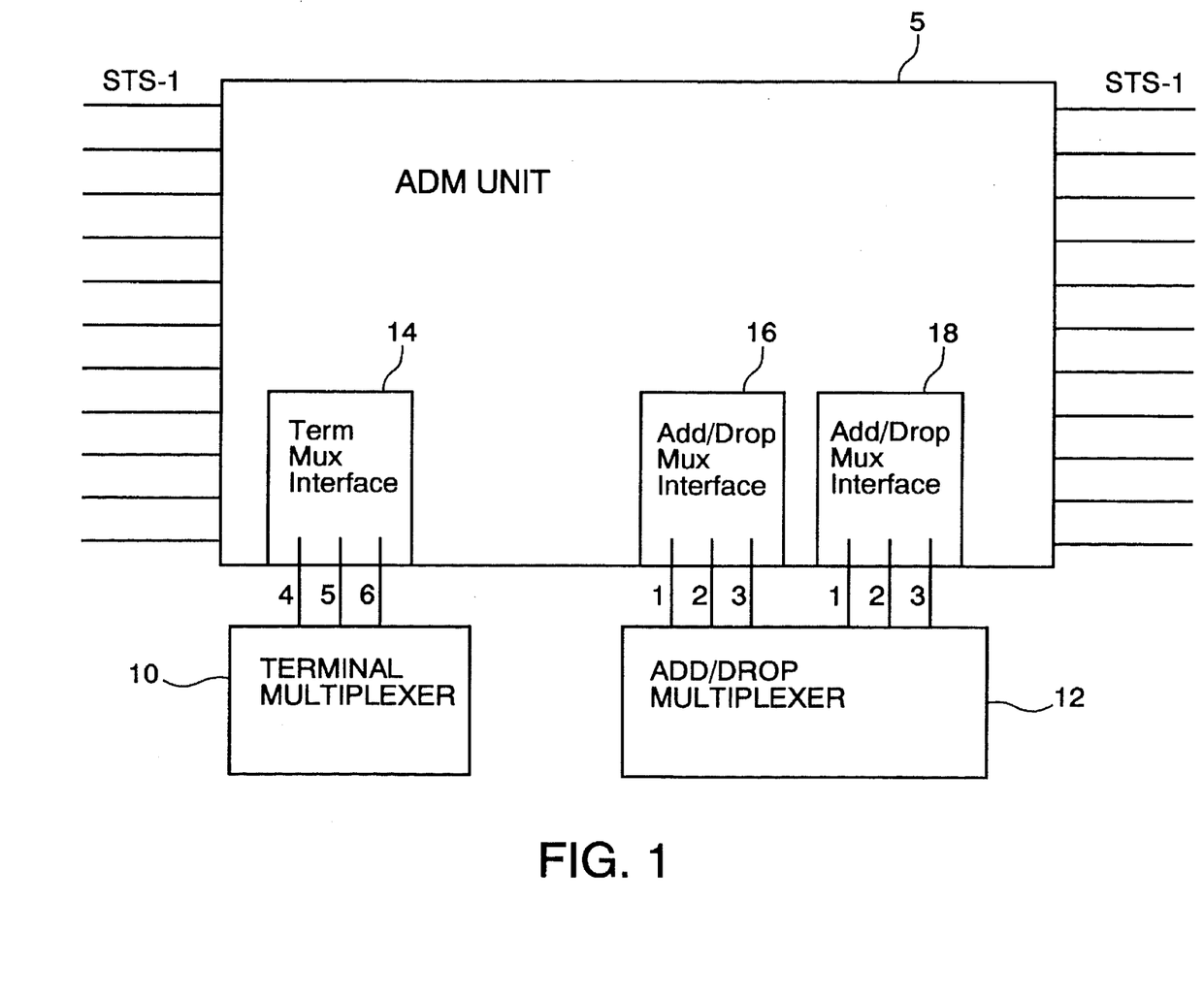
FIG. 1 is a schematic diagram of typical terminal and Add/Drop multiplexers utilized in a unidirectional SONET ring.

With reference to FIG. 1 of the drawings, there is shown Terminal and Add/Drop multiplexers 10 and 12 which are directed for use in a unidirectional SONET ring. As shown, Terminal multiplexer 10 serves channels 4, 5 and 6 at interface port 14. In contrast, Add/Drop multiplexer 12 serves channels 1, 2 and 3 at interface ports 16 and 18, yet consumes twice as much space in the ADM unit 20.

In general, the present invention is directed for use with single unidirectional or bidirectional ring optimizers. The single ring optimizer is designed to provide optimal routing of DS1 traffic in a unidirectional or bidirectional SONET ring. The single ring optimizer works with the limitations of currently available multiplexing equipment such as that supplied by Fujitsu. As explained in further detail below, the output of the optimizer is detailed information describing how to pack the DS1 demands into STS-1 time slots (channels), what equipment is required at each node, and how to assign the channels to this equipment. Both unidirectional and bidirectional versions find the true optimal solution (with respect to minimizing costs) if there is only DS1 traffic. In the event of DS3, STS-1 or OC1 traffic, the unidirectional version will find the optimal solution. The bidirectional version may not, since a heuristic approach must be used to route some of the DS3 traffic.

Referring still to FIG. 1 of the drawings, it is seen and known to those skilled in the art that a unidirectional SONET ring has several (3, 12 or 48) STS-1 channels, each of which may carry 28 units of DS1 traffic. If greater than or equal to an OC12, each node must therefore be equipped with an ADM unit 5 with room for k interface ports where k is the number of channels divided by 3. For every STS-1 channel, there are therefore two options. Either the entire channel may be devoted to routing a single point-to-point demand, or one or more DS1 demands may be "packed" into the channel. In the first case, a Terminal multiplexer 10 will be used at each end point of the demand. In the second case, an Add/Drop multiplexer 12—a more expensive component—must be used. The Terminal multiplexer consumes one of the ADM interface ports 14 available at ADM 5. An Add/Drop multiplexer consumes two of the ports 16 and 18. Each multiplexer (Terminal or Add/Drop) may service three STS-1 channels. An important part of the problem addressed and resolved by the present invention is how to balance the trade-offs between Terminal multiplexers and Add/Drop multiplexers.

Significantly, in spite of the added expense and interface port requirements of the Add/Drop multiplexer, it is often advantageous to use them in order to optimize the use of the available ring bandwidth. For example, in the Fujitsu technical article "Engineering SONET Rings II: The Sequel", referenced above, there is provided an example of a list of DS1 demands whose total demand sums to 313 DS1s which is less than the total capacity of an OC12 ring (336). Yet, if only Terminal multiplexers were used, three OC12 rings would be required. Thus, in order to route the traffic on one OC ring, careful packing of the DS1 demand into channels is required. In accordance with the present invention, this packing may be optimized to minimize the total cost of the multiplexers, i.e. Terminal multiplexers 10 and Add/Drop multiplexers 12 and the ADM interface ports 14, 16, 18, etc. which are required.

The present invention thus utilizes a Mixed Integer Program as referenced above and shown below which assumes that the demand has been preprocessed to route all DS3, OC1 and STS-1 traffic. Also, all demand blocks of 28 DS1 are assumed to have been already routed and assigned to channels in the unidirectional application described below. In the MIP utilized, the term offset(k) is used to denote the total number of 28 DS1 blocks that were preprocessed at node k. DS3(k) will therefore denote the total number of DS3, STS-1, or OC1 plugs consumed at node k.

N=set of nodes, 1, . . . ,n
W=set of demands i
C=set of STS-1 channels on the ring For all demands i∈W let $d_i$=the amount of demand i. We will say demand i terminates at node k if it either starts or ends at node k.

Consider the following variables:

$f_{ij}$=the amount of demand i on channel j.

$V_{kj}$ is a binary variable set to 1 if channel j has an Add/Drop multiplexer adding or dropping traffic from channel j at node k. Let $u_{kj}$ be a binary variable indicating that a Terminal multiplexer has been used for node k and channel j.

Let $z_{ij}$ be a binary variable set to 1 if channel j is entirely devoted to demand i. In this case, a Terminal multiplexer will be used to add and drop the traffic of channel j. Note that if $z_{ij}$ is 0, it is still possible that demand i is the only demand routed on channel j.

$y_k$ is an integer variable equal to the number of OC3 Add/Drop multiplexers used at node k, and $w_k$ is the number of Terminal multiplexers used as node k. Let $C_a$ denote the cost of installing an Add/Drop multiplexer including the cost of the two OC3 interface ports it consumes. Let $C_b$ denote the cost of installing a Terminal multiplexer including the cost of the one OC3 interface port it consumes.

The following MIP is therefore provided which, when minimized, minimizes the cost of the multiplexers and interface ports installed:

$$\min \sum_{k \in N} (C_a y_k + C_b w_k)$$

Mathematical Constraints

In order to further reduce the computation time necessary to obtain an optimized solution for traffic routing, additional mathematical constraints must be identified and utilized.

Entire Channel Constraints. For every channel j∈C we must have $$\sum_{i \in W} z_{ij} \leq 1.$$

Also, the user cannot assign a Terminal multiplexer for channel j at node k unless some demand terminating at node k has channel j entirely devoted to it. So for all nodes k and all channels j:

$$u_{kj} \leq \sum_{\substack{\text{demand } i \\ \text{terminates at } k}} z_{ij}.$$

And finally, if channel j is entirely devoted to demand i, no other demands can be routed in channel j. So for all demands i and channels j:

$$\sum_{l \neq i} f_{lj} \leq 28(1 - z_{ij}).$$

Demand Constraints. For all i∈W, $$\sum_{j \in C} f_{ij} = d_i$$

Count Terminating Channels. For all i∈W, j ∈C, the following constraint is needed:

$$f_{ij} \leq d_i u_{kj} + d_i v_{kj}$$

for each endpoint k of demand i.

Limit on OC3 interface ports. For all k∈N:

$$\sum_{j \in C} v_{kj} \leq 3y_k$$

and $$\sum_{j \in C} u_{kj} \leq 3w_k$$

and $$u_{kj} + v_{kj} \leq 1 \text{ for all } j \in C$$

and $$2y_k + w_k \leq \left\lfloor \frac{|C| - DS3(k)}{3} \right\rfloor.$$

Channel Capacity. For all channels j∈C:

$$\sum_{j \in W} f_{ij} \leq 28$$

Preprocessing

As referenced above, preprocessing is necessary in order to limit the number of possible solutions and thus reduce the computation time necessary to obtain an optimized solution. This preprocessing includes routing large demand blocks of traffic loads and imposing mathematical bounds on the above MIP variables. The preprocessing steps may be reduced to three generalized steps: (1) Demand and Channel Reduction; (2) Add/Drop Requirements Preprocessing; and (3) Symmetry Preprocessing. Add/Drop Requirements Preprocessing may, in turn, be generalized into three substeps: (a) Bounding The Number Of Terminal Channels; (b) Bounding The Multiplexers At Node k; and (c) Bounding The Total Number 0f Add/Drop Multiplexers.

1. Demand And Channel Reduction

Every demand $d_i$ will consume at least $\lfloor d_i/28 \rfloor$ entire channels. Therefore, one can pre-assign each 28 DS1 of a given demand to an entire channel, thus decreasing the amount of demand and the number of available channels. If 1 STS-1 units of demand have been subtracted from demands terminating at node k, define offset(k)=1. Then we must add a constraint to take into account the offset's requirement for interface ports:

For all $k \in N$ $$\sum_{j \in C} (v_{kj} + u_{kj}) \leq 3y_k + 3w_k - \text{offset}(k).$$

This constraint ensures that the offset demand has Add/Drop capacity available in either a Terminal multiplexer or an Add/Drop multiplexer. Since the preprocessing only routes one demand per channel, either type of multiplexer can be used.

2. Add/Drop Requirements Preprocessing

It is vital to do some preprocessing to impose bounds on the z, u, v and w variables. The various applicable approaches are further disclosed below.

a. Bounding Number Of Terminal Channels

The following procedure bounds the number of terminal channels. Sort the demands in non-increasing order. Suppose that the user has l terminal channels. At best, the largest l demands are in these channels. The user must therefore have enough capacity in the remaining channels to route the rest of the demands. If not, there can be at most l-1 terminal channels.

So for l=1, . . . , assume that the l largest demands have been given an entire channel. Check whether there is enough capacity in the remaining channels for the remaining demands. The first time the user gets stuck, she will know that w=l-1 is a bound on $\Sigma_{i \in W} \Sigma_{j \in C} z_{ij}$. Also, t=2*(l-1) will be a bound on $\Sigma_{k \in N} \Sigma_{j \in C} u_{kj}$.

b. Bounding the Multiplexers At Node k

As above, let $D_k$ denote the total demand at node k. Then it is known that at least $m_k = \lceil D_k/28 \rceil$ channels must be multiplexed at node k. The same procedure as that given in the previous subsection can be used to bound the number of terminal channels that can be multiplexed at node k. Let this bound be $t_k$. Let $t_k$=min $\{t_k, w,$ number of demands at node k$\}$. Then $\Sigma_{j \in C} u_{kj} \leq t_k$ and $\Sigma_{j \in C} v_{kj} \geq m_k - t_k$ are valid inequalities that can be added to the information. Also, we can add $y_k \geq \lceil m_k - t_k/3 \rceil$.

c. Bounding The Total Number of Add/Drop Multiplexers From Below

In order to bound $\Sigma_{k \in N} \Sigma_{j \in C} v_{kj}$, the user could just sum the $m_k - t_k$'s from above. However, much closer bounding can be obtained.

Let w be the upper bound on the number of terminal channels determined above. If the number of demands is less than or equal to w, or if w equals the total number of channels, the desired bound in just 0. Let D be the total number of demands less w. So at least w demands must be routed in non-terminal channels.

Otherwise, the remaining C−w channels must all have at least two demands (and so three nodes) "muxed" in them. Let $s_j$ be the number of demands that will be routed in channel j, for $j \in C' \equiv C/w$. Then if $x_j$ is the number of nodes "muxed" in channel j, we must assume that $$x_j \geq \frac{1 + \sqrt{1 + 8*s_j}}{2}, \text{ since } s_j \leq \binom{x_j}{2}.$$

Thus, $$\Sigma_{k \in N} \Sigma_{j \in C} v_{kj} = \Sigma_{j \in C} x_j \geq \Sigma_{j \in C} x_j \geq \Sigma_{j \in C} \frac{1 + \sqrt{1 + 8*s_j}}{2}.$$

In order to get a valid lower bound, we need to find $s_j$'s minimizing the right hand side. The maximum occurs when the $s_j$'s are all equal. The minimum will occur at the boundary, when as many $s_j$'s as possible are 2. One $s_j$ will have to make up the rest of the demands. Note that the final $s_j$ may never really get that large, but then the problem becomes highly complicated to ensure that we really are obtaining a minimum value. So to be safe, the bound that is coded in the program is:

$$(|C'| - 1) * \left\lceil \frac{1 + \sqrt{1 + 8*2}}{2} \right\rceil + \left\lceil \frac{1 + \sqrt{1 + 8*(D - (|C'| - 1)*2)}}{2} \right\rceil.$$

3. Symmetry Preprocessing

In order to reduce the number of symmetric branches processed by the MIP, some of the demands can be preassigned to channels. For Example, let $D_k$ be defined as above to be the total demand terminating at node k. Let $v^*_{kj}$ denote $v_{kj} + u_{kj}$. Because of symmetry, we can set $v^*_{11}, v^*_{12}, \ldots, v^*_{1l}$, all equal to 1, where $l = \lceil D_1/28 \rceil$. Now consider demand 2. If $\lceil D_1 + D_2/28 \rceil = s$, then we can (again due to symmetry), set $v^*_{2(l+1)}, \ldots, v^*_{2s}$ all to be 1. If s=l, it will become necessary to add more nodes in until more than l channels is required. In such case, the sum of several $v^*$'s set to one will be obtained. This process may be continued (next considering $D_1 + D_2 + D_3$) until the user runs out of channels or runs out of nodes.

If the bound on the number of terminal multiplexers w computed above is small, one further step may be followed to eliminate many variables. The user may delete the assignments to channels 1, . . . , w above, and set $z_{ij}$=0, for all $i \in W$, and all j>w. This in turn forces many of the $u_{kj}$'s to be 0.

Allowing Infeasibility

If the user desires to model the situation where all traffic cannot be routed on the given ring, a slack variable $s_i$ may be added to each demand constraint giving: For all $i \in W$:

$$\sum_{j \in C'} f_{ij} + s_i = d_i.$$

The objective would be modified to include the term $$\sum_{i \in W} M s_i,$$

where M could be set to $$|N| \cdot \max \left\{ \frac{|C|}{6} C_a, \frac{|C|}{3} C_b \right\}.$$

Thus, the infeasibility will be minimized before the costs.

Valid Inequalities

Muxes at Node. For every node k∈N let $D_k$ denote the total demand terminating at node k. Then at least $\lceil D_k/28 \rceil$ channels will have to be multiplexed at k. Thus, for every node k:

$$\sum_{j \in C} (v_{kj} + u_{kj}) \geq \left\lceil \frac{D_k}{28} \right\rceil$$

Note: These inequalities are not valid if infeasibility is allowed as in the previous section.

Term Muxes. $z_{ij}$ will be zero, unless at least one of the endpoints of demand i in channel j is muxed through a terminal mux. Thus, for each demand i with origin s and destination t, and for all channels j, $$z_{ij} \leq u_{sj} + u_{tj}.$$

Active Muxes. A channel cannot be multiplexed through an Add/Drop (Terminal) multiplexer, unless the multiplexer is actually there. Thus, for all nodes k and for all channels j, $$u_{kj} \leq w_k$$

and $$v_{kj} \leq y_k.$$

More Muxes at Node. If no preprocessing has occurred, offset(k) is 0. Otherwise, see the following section for the definition of offset. Thus, at node k:

$$3y_k + 3w_k - \text{offset}(k) \geq \left\lceil \frac{D_k}{28} \right\rceil$$

giving $$y_k + w_k \geq \left\lceil \frac{\frac{|D_k|}{28} + \text{offset}(k)}{3} \right\rceil.$$

As those skilled in the art will recognize, these inequalities are not valid if infeasibility is allowed as in the previous section.

Significantly, the present invention is also applicable to bidirectional SONET rings which those skilled in the art will also recognize as providing a more efficient use of the available capacity. When traffic is routed between two nodes on a bidirectional ring, only capacity on the links between them is consumed, rather than on the whole ring. It is recognized, however, that there are two possible paths between each pair of nodes on a bidirectional ring. Thus, in addition to the considerations for packing DS1 traffic in a unidirectional case, the path that each demand uses in each channel must be considered. It is perhaps simpler to think of the rings still having [C] channels, with each channel divided into segments which are the paths being used. Each direction coming into a node must be handled separately by the multiplexer of that node. In optimizing traffic loading in accordance with the present invention for bidirectional rings, the following assumptions must therefore be made.

Terminal Multiplexers. If a terminal multiplexer is used for a given path in a channel, there can be only one demand using any of that path.

DS3 Traffic. The user cannot entirely preprocess DS3 traffic as before. The user may, however, entirely preprocess multiples of 2 DS3, by packing them into a channel in both directions. The remainders of 1 however, will have to be included in the formulation. It will have to be treated differently from the DS1 traffic, since it can't be split and mixed with DS1 traffic. To deal properly with DS3 traffic, it would have to be included in the MIP formulation. For now, multiples of 2 DS3 are routed on one channel in both directions as it should be. Remaining multiples of 1 are heuristically routed on their shortest paths.

Consumption of Interface Ports. If a node has a path being multiplexed there in both directions in the same channel, there are two options, (1) it can be dropped through a Terminal multiplexer in each direction, consuming two of the three ports; or (2) an Add/Drop multiplexer can be used. Add/Drop multiplexers do not waste as much of the capacity at a node in the unidirectional case. Here one of its three ports will be used (or two of its six, depending on the user's point of view).

Multiples of 28 DS1 Traffic. Multiples of 56 can be preprocessed by having it entirely consume 1 channel in both directions. However, the number of interface ports consumed depends now on whether the user chooses to multiplex the offset channels with Terminal or Add/Drop multiplexers. The final constraint in the formulation below ensures that there is enough capacity at each node to multiplex the preprocessed demand through a Terminal or an Add/Drop multiplexer. Let offset(k) denote the amount of traffic offset at node k in multiples of 28. This will always be an even number.

Order of Nodes on Rings. It must be assumed that the nodes are numbered consecutively on the ring from 0 to n−1. Link i is between node i and node i+1.

Again, a Mixed integer Program is utilized having corresponding variables to model the cost of Terminal multiplexers, Add/Drop multiplexers and corresponding interface ports necessary to route the traffic loads.

Formulation

N=set of nodes, 1, . . . ,n
W=set of demands i
C=set of STS1 service channels on the ring. Note that for the 2 fiber bidirectional ring this will be only half the total number of channels, since the other half are reserved for protection. C may have been diminished by DS1 and DS3 preprocessing. Let $C^o$ denote the entire set of channels (so $|C^o|$ is the capacity of the ring before preprocessing and before the reservation of any channels for protection).
For all demands i∈W let
$d_i$=the amount of demand i. Let $s_i$ denote the start of demand i and let $t_i$ denote the destination of demand i. (Note the start and end are arbitrary, and depends only on how the user inputs the demands). For a given demand i, let $P_i^+$ denote the path starting on link $s_i-1$ and ending on link $t_i$. For a given link l, let $D_l^+$ denote the set of demands whose + paths use l. Similarly, let $D_l^-$ denote the set of demands whose − paths use l. Let
$W_k$ denote the set of demands starting or ending at node k.
Consider the following variables:
$f_{ij}$=the amount of demand i on channel j using path $P_i^+$.

$g_{ij}$=the amount of demand i on channel j using path $P_i^-$.

$v_{kj}$ is a binary variable set to 1 if channel j has an Add/Drop multiplexer adding or dropping traffic from channel j at node k. Let $u_{kj}^-$ be a binary variable indicating that a Terminal multiplexer has bee used for node k and channel j on the − side (link k−1) of node k. Let $u_{kj}^+$ be a binary variable indicating that a Terminal multiplexer has been used for node k and channel j on the + side (link k) of node k.

Let $z_{ij}^+$ be a binary variable set to 1 if $P_i^+$ in channel j is entirely devoted to demand i. Let $z_{ij}^-$ be a binary variable set to 1 if $P_i^-$ in channel j is entirely devoted to demand i. In either of these cases, a Terminal multiplexer will be used to add and drop the traffic at at least one end of the path. Note that if $z_{ij}$ (+ or −) is 0, it is still possible that demand i is the only demand routed on the path in channel j.

$y_k$ is an integer variable equal to the number of OC3 Add/Drop multiplexers used at node k, and $w_k$ is the number of Terminal multiplexers used at node k. Let $C_a$ denote the cost of installing an Add/Drop multiplexer including the cost of the two OC3 interface ports it consumes. Let $C_t$ denote the cost of installing a Terminal multiplexer including the cost of the one OC3 interface port it consumes.

The following MIP is thus obtained which, when minimized, will correspondingly minimize the cost of the multiplexers and interface ports installed.

Objective $$\min \sum_{k \in N} (C_a y_k + C_b w_k)$$

As in the case of unidirectional rings, preprocessing is also required. Additional mathematical constraints must also be identified and utilized such as those provided below.

Entire Channel Constraints. For every channel j∈C and every link l, we must have $$\sum_{i \in D_l^+} z_{ij}^+ + \sum_{i \in D_l^-} z_{ij}^- \leq 1.$$

It should be noted that the user cannot assign a Terminal multiplexer for channel j at node k unless some demand terminating at node k has channel j entirely devoted to it. So for all nodes k and all channels j:

$$u_{kj}^+ \leq \sum_{i \text{ starts at } k} z_{ij}^+ + \sum_{i \text{ ends at } k} z_{ij}^-$$

and $$u_{kj}^- \leq \sum_{i \text{ starts at } k} z_{ij}^- + \sum_{i \text{ ends at } k} z_{ij}^+$$

And finally, if a path in channel j is entirely devoted to demand i, no other demands can be routed on any part of that path. So for all demands i and channels j:

$$\sum_{\substack{l \neq i \\ P_l^+ \cap P_i^+ \neq \phi}} f_{lj} + \sum_{\substack{l \neq i \\ P_l^- \cap P_i^+ \neq \phi}} g_{lj} \leq B_{ij}^+(1 - z_{ij}^+)$$

and $$\sum_{\substack{l \neq i \\ P_l^+ \cap P_i^- \neq \phi}} f_{lj} + \sum_{\substack{l \neq i \\ P_l^- \cap P_i^- \neq \phi}} g_{lj} \leq B_{ij}^-(1 - z_{ij}^-)$$

The $B_{ij}$'s are constants bounding the left hand sides. Trivially, $B_{ij}^+$ could be set at 28×(the number of links in $P_i^+$) and similarly for $B_{ij}^-$. A better choice of $B_{ij}^+$ is 28 times the maximum number of non-overlapping paths intersecting $P_i^+$. Similarly, $B_{ij}^-$ can be assigned the value of 28 times the maximum number of non-overlapping paths intersecting $P_i^+$.

It is these values of B that have been implemented. The maximum number of non-overlapping paths in a set of paths is a hypergraph matching problem which can be solved by solving a MIP as described in the preprocessing section below.

Demand Constraints. For all i∈W, $$\sum_{j \in C} (f_{ij} + g_{ij}) = d_i$$

Count Terminating Channels. For all k∈N, let $B_k = \min\{D_k, 28\}$. Then for all j∈C, k∈N, the following constraint is obtained:

$$\sum_{\substack{i \in W \\ k=s_i}} f_{ij} + \sum_{\substack{i \in W \\ k=t_i}} g_{ij} \leq B(u_{kj}^+ + v_{kj})$$

and $$\sum_{\substack{i \in W \\ k=t_i}} f_{ij} + \sum_{\substack{i \in W \\ k=s_i}} g_{ij} \leq B(u_{kj}^- + v_{kj}).$$

Limit on OC3 Interface Ports. For all k∈N:

$$\sum_{j \in C} v_{kj} \leq 3 y_k$$

and $$\sum_{j \in C} (u_{kj}^+ + u_{kj}^-) \leq 3 w_k$$

and for all j∈C and k∈N, $$u_{kj}^+ + v_{kj} \leq 1$$

and $$u_{kj}^- + v_{kj} \leq 1.$$

Finally, because of the capacity at the nodes:

$$2y_k + w_k \leq \left\lfloor \frac{|C| - (\text{number of } DS3 \text{ plugs at node } k)}{3} \right\rfloor.$$

Channel Capacity. For all channels j∈C and all links l, let $c_{ij}$ be 28 unless link l in channel j was consumed by DS3 preprocessing, in which case $c_{ij}$ will be 0.

$$\sum_{\substack{i \in w \\ l \in P_i^+}} f_{ij} + \sum_{\substack{i \in w \\ l \in P_i^-}} g_{ij} \leq c_{lj}.$$

Capacity For Preprocessed Demand. This is a little different from the unidirectional case. An offset demand will consume an entire channel on both paths. So it will consume 1 of the 3 ports at an Add/Drop mux (or 2 or the 6 if you like to look at it that way), or 2 of the 3 ports at a terminal mux. Remember that offset(k) is an even multiple of 28. So we have:

$$\sum_{j \in C} (2v_{kj} + u_{kj}^+ + u_{kj}^-) \leq 6y_k + 3w_k - \text{offset}(k).$$

Valid Inequalities

Muxes at Node. For every node k∈N let $D_k$ denote the total demand terminating at node k. Then at least $\lceil D_k/28 \rceil$ paths will have to be muxed at k. So for every node k, $$\sum_{j\epsilon C} (2v_{kj} + u^+_{kj} + u^-_{kj}) \le \left\lceil \frac{D_k}{28} \right\rceil.$$

From this and the "Capacity for Preprocessed Demand" inequality it can be concluded that the following is also valid for all k∈N. This is implied except for the round-up.

$$2y_k + w_k \ge \left\lceil \frac{\left\lceil \frac{D_k}{28} \right\rceil + \text{offset}(k)}{3} \right\rceil$$

Space at Add/Drop Muxes for DS3 Traffic. The following can be derived algebraically, so it is implied except for the round down. For all nodes k, $$3y_k - \sum_{j\epsilon C} v_{kj} \le \left\lfloor \frac{3l - \left\lceil \frac{D_k}{28} \right\rceil}{3} \right\rfloor$$

where $$l = \frac{|C^0| - (\text{number of } DS3 \text{ plugs at node } k)}{3}.$$

Preprocessing

Demand and Channel Reduction. As noted above, any demand with at least 56 DS1 can be reduced by preassigning each 56 units to an entire channel. Both paths in this channel will be used. The "Capacity for Preprocessed Demand" constraint ensures that there is space to multiplex this demand at either an Add/Drop multiplexer or a Terminal multiplexer. (Either can be used for this demand).

Preprocessing Using Hypergraph Matching. The remaining preprocessing concepts rely on calculating, given a ring and a set of paths around that ring, the maximum number of non-overlapping paths. This will be calculated for a variety of different path sets. If Q is a set of paths, let M(Q) denote the largest number of non-overlapping paths in Q. Note that this is the solution of a hypergraph matching problem which can be solved as an MIP.

Bounds on Flows and Terminal Paths. Let M be the maximum number of non-overlapping paths over all plus and minus paths of all demands. Then clearly there can be at most M terminal paths in any channel. Similarly, if $M^+$ is the maximum number of non-overlapping plus paths, and $M^-$ is the maximum number of non-overlapping minus paths, the following inequalities that can be added to the formulation are obtained.

For every channel j we have, $$\sum_{i\epsilon W} (z^+_{ij} + z^-_{ij}) \le M,$$

and $$\sum_{i\epsilon W} z^+_{ij} \le M^+,$$

and $$\sum_{i\epsilon W} z^-_{ij} \le M^-,$$

and $$\sum_{k\epsilon N} (u^+_{kj} + u^-_{kj}) \le 2M,$$

and $$\sum_{i\epsilon W} (f_{ij} + g_{ij}) \le M * 28,$$

and $$\sum_{i\epsilon W} f_{ij} \le M^+ * 28,$$

and finally $$\sum_{i\epsilon W} g_{ij} \le M^- * 28.$$

Bounds on Muxes. The user may also try to bound the number of different types of muxes at each node. Consider, for example, trying to bound the number of terminal paths starting or ending at node k. Let $D_{n/k}$ denote the sum of all demands that do not start or end at node k, and let Q be the set of paths for these demands that do not go through node k. Let, $$l = \left\lceil \frac{D_{N/k}}{28.0} \right\rceil - |C|*M(Q).$$

Then at least l channels will have to contain a path routed through k, so at most 2*(|C|−l) terminal paths can terminate at node k. Let $b_k = \min\{2*(|C|-l), \text{number of demands terminating at node k}\}$. Then we can conclude:

$$\sum_{j\epsilon C} (u^+_{kj} + u^-_{kj}) \le b_k,$$

and $$\sum_{j\epsilon C} \sum_{i\epsilon W_k} (z^+_{ij} + z^-_{ij}) \le b_k.$$

A lower bound on the sum of the v's at node k may thus be computed by considering the remaining demand after the maximum number of terminal paths have been used, as in the unidirectional case.

Symmetry Preprocessing. As with the unidirectional case, it is advantageous to preassign some multiplexers in certain channels when possible, to reduce the symmetry of the branch and bound tree. If Q is a set of demands, then the minimum set of channels required by the set is $$\left\lceil \frac{\left\lceil \frac{D_Q}{28.0} \right\rceil}{M(Q)} \right\rceil.$$

Note that the user must address the demands one at a time, augmenting Q. Every time the number of channels required increases by 1, the set of demands must be assigned, causing it to increase to that new channel.

Figure 2:
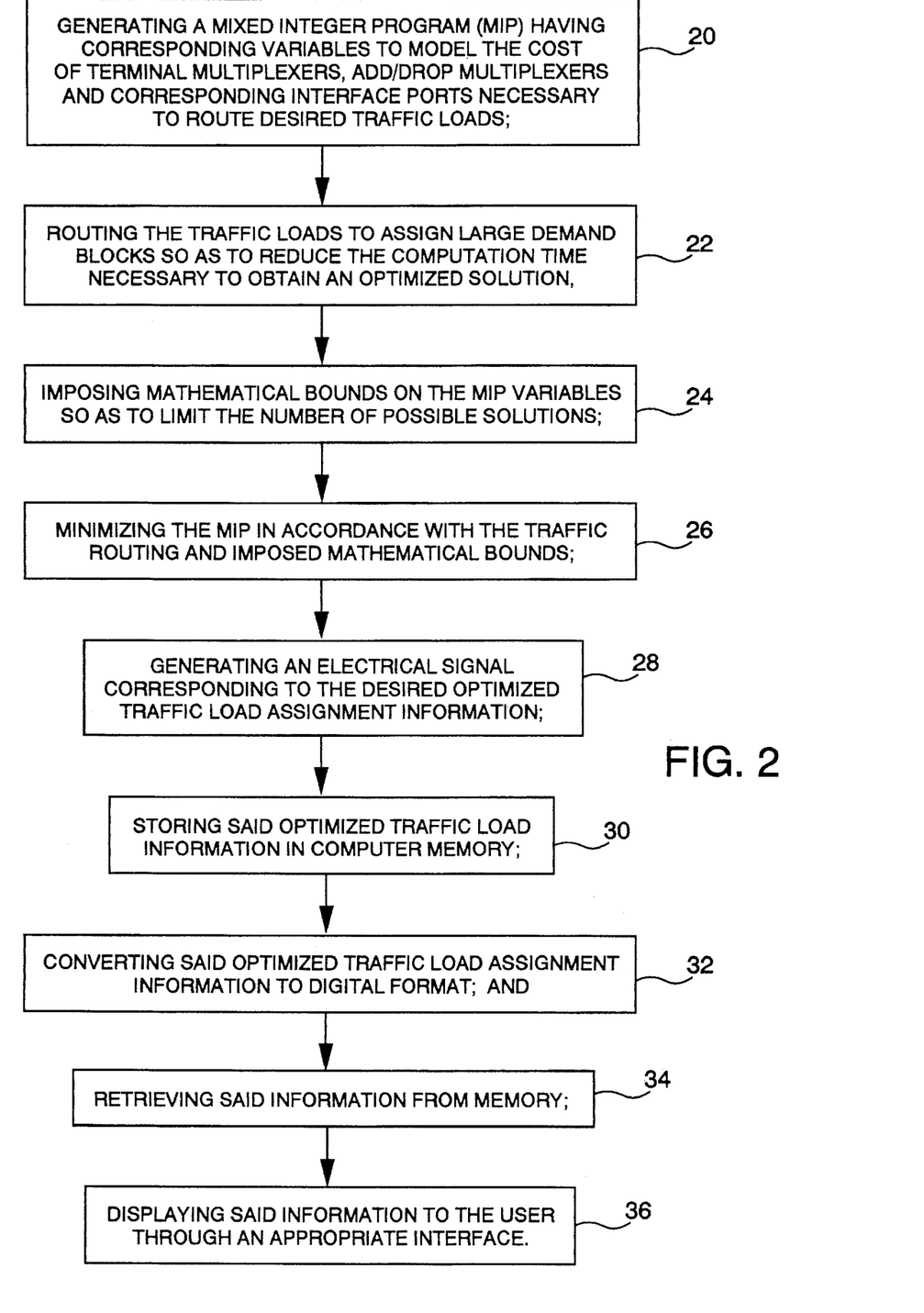
FIG. 2 is a generalized block diagram of the method steps of the present invention.

As referenced above, the optimized traffic load assignment information resulting from the minimized mixed integer program may be converted to digital format and stored in conventional computer memory. The information may thereafter be retrieved from memory and displayed to the user through an appropriate interface. As shown in FIG. 2, the generalized method of the present invention thus requires generating 20 a Mixed Integer Program (MIP) having corresponding variables to model the cost of Terminal multiplexers 10, Add/Drop multiplexers 12 and corresponding interface ports 14, 16 and 18 etc. which are necessary to route desired traffic loads. The method further includes routing 22 the traffic loads to assign large demand blocks so as to reduce the computation time necessary to obtain an optimized solution. Mathematical bounds must further be imposed 24 on the MIP variables so as to limit the number of possible solutions.

By minimizing 26 the MIP in accordance with the above traffic routing and imposed mathematical bounds, an electrical signal may be generated 28 corresponding to the desired optimized traffic load assignment information. This information, which is directed for receipt and storage 30 in conventional computer memory, which is known to those skilled in the art, may thereafter be converted 32 to digital format, retrieved 34 and displayed 36 to the user through an appropriate interface as indicated above.

While the best mode for carrying out the invention has been described in detail, those familiar with the art to which this invention relates will recognize various alternative designs and embodiments for practicing the invention as defined by the following claims.

What is claimed is:

1. For use in cooperation with a computer having memory, a method of assigning inter-nodal traffic loads to channels in SONET rings, comprising;

generating the following Mixed Integer Program (MIP) to model the cost of SONET Terminal multiplexers, SONET Add/Drop Multiplexers and corresponding interface ports necessary to route said traffic loads:

$$\min \sum_{k \in N} (C_a Y_k + C_b W_k)$$

Constraints:

(a) For every channel $j \in C$ we must have $$\sum_{i \in W} z_{ij} \leq 1;$$

(b) For all nodes k and all channels j:
(c) For all demands i and channels j:

$$\sum_{l \neq i} f_{lj} \leq 28(1 - z_{ij});$$

$$\sum_{l \neq i} f_{lj} \leq 28(1 - z_{ij});$$

(d) For all $i \in W$, $$\sum_{l \neq i} f_{lj} \leq 28(1 - z_{ij});$$

(e) For all $i \in W$, $j \in C$:

$$f_{ij} \leq d_i u_{kj} + d_i v_{kj}$$

for each endpoint k of demand i;

(f) For all $k \in N$:

$$\sum_{j \in C} v_{kj} \leq 3y_k$$

and $$\sum_{j \in C} u_{kj} \leq 3w_k$$

and $$u_{kj} + v_{kj} \leq 1 \text{ for all } j \in C$$

and $$2y_k + w_k \leq \left\lfloor \frac{|C| - DS3(k)}{3} \right\rfloor;$$

(g) For all channels $j \in C$:

$$\sum_{j \in W} f_{ij} \leq 28$$

where,

N=set of nodes, 1, . . . ,n $Y_k$=an integer variable equal to the number of OC3 Add/Drop multiplexers used as node k, $W_k$=the number of Terminal multiplexers used at node k, $C_a$=the cost of installing an Add/Drop multiplexer including the cost of the two OC3 interface ports it consumes, $C_b$=the cost of installing a Terminal multiplexer including the cost of the one OC3 interface port it consumes;

routing said traffic loads to assign large demand blocks and imposing mathematical bounds on said MIP variables so as to limit the number of possible solutions;

minimizing said MIP in accordance with said traffic routing and said imposed mathematical bounds;

storing in the memory of the computer optimized traffic load assignment information corresponding to the minimized MIP; and assigning internodal traffic loads to channels in said assignment rings in accordance with said optimized traffic load assignment information.

2. The method of claim 1, further comprising:

determining a bound on the maximum number of said SONET Terminal and SONET Add/Drop multiplexers over a maximum number of multiplexers that could be used at a given node;

determining a bound on the maximum number of terminal channels, a terminal channel defined as a channel which drops DS1 lines through a SONET Add/Drop multiplexer configured in an Add/Drop mode;

determining a bound on a minimum number of multiplexers needed at each of said nodes;

determining a bound on a minimum total number of Add/Drop multiplexers needed for all of said nodes; and preassigning selected multiplexers at selected nodes to selected channels in order to reduce the number of symmetric branches processed by said MIP.

3. The method of claim 2, wherein said step of determining the minimum number of multiplexers needed at each of said nodes further comprises:

determining the maximum number of Terminal multiplexers needed at each of said nodes; and determining the minimum number of Add/Drop multiplexers needed at each of said nodes.

* * * * *